United States Patent
Kempke et al.

(10) Patent No.: US 10,338,118 B1
(45) Date of Patent: Jul. 2, 2019

(54) SYSTEM AND METHODS FOR DETECTING AND CHARACTERIZING ELECTROMAGNETIC EMISSIONS

(71) Applicant: Aurora Insight Inc., Washington, DC (US)

(72) Inventors: Benjamin Kempke, Ann Arbor, MI (US); Dan Lisogurski, Westminster, CO (US); Jennifer Alvarez, Westminster, WI (US)

(73) Assignee: Aurora Insight Inc., Washington, DC (US)

( * ) Notice: Subject to any disclaimer, the term of this patent is extended or adjusted under 35 U.S.C. 154(b) by 0 days.

(21) Appl. No.: 15/991,540

(22) Filed: May 29, 2018

Related U.S. Application Data

(60) Provisional application No. 62/656,781, filed on Apr. 12, 2018.

(51) Int. Cl.
*H04B 7/00* (2006.01)
*G01R 23/167* (2006.01)

(52) U.S. Cl.
CPC .................. *G01R 23/167* (2013.01)

(58) Field of Classification Search
CPC ...... G01R 23/167; H04B 17/23; H04B 17/27; H04B 17/309; H04B 17/318; H04W 16/14; H04W 24/08
USPC ............ 455/66.11, 67.11; 343/700; 370/252; 375/340
See application file for complete search history.

(56) References Cited

U.S. PATENT DOCUMENTS

| | | | | |
|---|---|---|---|---|
| 8,155,039 | B2 * | 4/2012 | Wu ................. | H04H 20/02 370/310 |
| 8,515,473 | B2 * | 8/2013 | Mody ................ | H04K 3/226 455/450 |
| 8,805,292 | B1 * | 8/2014 | Carbajal ............ | H04W 24/08 455/67.11 |
| 2010/0020707 | A1 * | 1/2010 | Woodings ........... | H04L 43/045 370/252 |
| 2010/0119016 | A1 * | 5/2010 | Ghosh ............... | H04L 5/0058 375/340 |
| 2011/0111751 | A1 * | 5/2011 | Markhovsky ....... | G01S 3/74 455/423 |
| 2011/0117869 | A1 * | 5/2011 | Woodings ........... | G01R 23/16 455/226.4 |
| 2012/0014332 | A1 * | 1/2012 | Smith ............... | H04W 16/14 370/329 |

(Continued)

OTHER PUBLICATIONS

Stottler, Richard et al.; "Automated Terrestrial EMI Emitter Detection, Classification, and Localization"; AMOS 2016.

*Primary Examiner* — Edward F Urban
*Assistant Examiner* — Max Mathew
(74) *Attorney, Agent, or Firm* — Brian R. Galvin; Brian S. Boon; Galvin Patent Law, LLC

(57) ABSTRACT

A system and method for detecting and identifying emitted electromagnetic signals, comprising wideband radio frequency sensors, at least one wide band radio frequency receiving antenna and accompanying electronics, a platform for hosting multiple antennas and sensor mounts, and processing algorithms for detection and identification of electromagnetic (EM) signals. Various algorithms and implementations are employed to detect and identify, over a wide frequency range, narrow or wide bandwidth EM signals having low signal levels, time-varying, and/or time-intermittent characteristics.

12 Claims, 13 Drawing Sheets

(56) References Cited

U.S. PATENT DOCUMENTS

| | | | |
|---|---|---|---|
| 2012/0214511 A1* | 8/2012 | Vartanian | G01S 15/08 455/456.1 |
| 2012/0302190 A1* | 11/2012 | McHenry | H04B 17/345 455/226.3 |
| 2012/0322487 A1* | 12/2012 | Stanforth | H04W 16/14 455/509 |
| 2013/0005374 A1* | 1/2013 | Uusitalo | H04W 28/26 455/509 |
| 2013/0035108 A1* | 2/2013 | Joslyn | H04W 24/08 455/454 |
| 2013/0035128 A1* | 2/2013 | Chan | H04W 72/085 455/513 |
| 2013/0052939 A1* | 2/2013 | Anniballi | H04H 60/44 455/3.01 |
| 2013/0090071 A1* | 4/2013 | Abraham | H04W 16/14 455/73 |
| 2013/0100154 A1* | 4/2013 | Woodings | G06T 11/206 345/589 |
| 2013/0165170 A1* | 6/2013 | Kang | H04W 72/0453 455/509 |
| 2013/0183994 A1* | 7/2013 | Ringstrom | H04W 72/082 455/452.1 |
| 2013/0190003 A1* | 7/2013 | Smith | H04W 4/90 455/452.1 |
| 2013/0208587 A1* | 8/2013 | Bala | H04W 16/14 370/230 |
| 2013/0242934 A1* | 9/2013 | Ueda | H04W 72/02 370/329 |
| 2013/0260703 A1* | 10/2013 | Actis | H03G 3/3042 455/127.2 |
| 2014/0129556 A1 | 5/2014 | Callahan | |
| 2015/0311972 A1 | 10/2015 | Mengwasser | |
| 2017/0373398 A1* | 12/2017 | Komulainen | H01Q 1/243 |

\* cited by examiner

SYSTEM AND METHODS FOR DETECTING AND CHARACTERIZING ELECTROMAGNETIC EMISSIONS

CROSS-REFERENCE TO RELATED APPLICATIONS

This application claims benefit of, and priority to, U.S. provisional patent application Ser. No. 62/656,781, titled "SYSTEM AND METHODS FOR DETECTING AND CHARACTERIZING ELECTROMAGNETIC EMISSIONS", which was filed on Apr. 12, 2018, the entire specifications of each of which are incorporated herein by reference.

BACKGROUND OF THE INVENTION

Field of the Art

The disclosure relates to the field of telecommunications and radiometry, more particularly the field of monitoring telecommunications activity and naturally occurring electromagnetic (EM) emissions over a wide area and wide bandwidth utilizing a custom hardware configuration, digital signal processing and statistical processing.

Discussion of the State of the Art

Most wireless telecommunication requires transmission and reception of EM signals in the radio frequency, microwave, and millimeter wave frequency bands. Mobile, backhaul, consumer, fixed station, and public safety communications, to name a few, rely on frequencies in the EM spectrum that are assigned, or allocated, for a particular use. Further, certain frequency bands are licensed to particular users in specified geographical areas.

Due to the proliferation of wireless communication applications, frequency bands for wireless communication in the EM spectrum are becoming a scarce natural resource. Efforts continue to be made to increase the efficiency of frequency usage by consolidating and assigning unused or minimally used frequencies, and by reallocating frequencies for use as demand dictates. Additionally, transmitter output power is being reduced to limit the effective area of a transmitted signal so that frequencies can be reused based on geographical diversity. Consumer demand and trends towards high-data rate communications, which requires the use of increasing bandwidth and efficient transmissions methods, drives these innovations. As the complexity of wireless systems naturally increases to support more users in discrete bands, better systematic knowledge of the spectrum environment is needed to ensure proper operation. Indeed, proposed approaches such as dynamic spectrum allocation and cognitive radio techniques for spectrum sharing, to further enhance efficiency of spectrum use, require good knowledge of the spectral environment.

Spectrum sharing requires the ability to determine if a frequency band is in use on a dynamic basis. Low received signal strength and signals that have time varying characteristics or are intermittent make sensing the presence of such signals difficult. Systems and techniques for detecting and identifying such signals are needed to enable a more efficient use of spectrum.

Other applications of the technology include sensing radio frequency signals from equipment, machinery, power lines, and power plants, plus emissions from natural phenomena such as forest fires and hurricanes.

Radio receivers tunable over a wide bandwidth and connected to a wide bandwidth antenna are ideal for this application but suffer from limitations. For example, these radios typically allow large amounts of energy in to the front end and the input signal must be sufficiently attenuated to avoid saturating the amplifiers, analog to digital converters or other components in the signal chain. Wide bandwidth radios also typically sample at high speed, which means they have less effective bits out of the analog-to-digital converter (ADC), as compared to narrowband radios with lower sample rates and higher resolution ADCs. Since low-energy signals are first attenuated and then sampled with fewer effective bits, they can be difficult to detect. For example, it may be of interest to detect high power downlink channels from a cell phone tower to multiple handsets but it may also be of interest and more difficult to detect much lower power uplink channels from individual cell phones back to a tower.

When the radio is mounted on a platform that emits radio signals, these signals may interfere with reception of the signals of interest. For example, an ADS-B transmitter on an aircraft may transmit at high power every 10 milliseconds and saturate the receiver of a wideband radio mounted on the aircraft, since the radio must be configured with a high gain to receive signals from lower power transmitters (e.g. cell phones) located several miles away.

What is needed is a sensor and methods for detecting and characterizing electromagnetic signals, to provide an accurate usage analysis of the electromagnetic spectrum in any given area.

SUMMARY OF THE INVENTION

Accordingly, the inventor has conceived and reduced to practice, in a preferred aspect of the invention, a system and methods for detecting and characterizing electromagnetic emissions. The following non-limiting summary of the invention is provided for clarity, and should be construed consistently with aspects described in the detailed description below.

To solve the problem of over-burdening the limited spectrum with too many users, a system and method have been devised for analyzing and identifying electromagnetic signals, so that any wireless service provider or similar entity seeking to use electromagnetic signals for communication may see exactly what frequencies and bands are being used. The system may be implemented using custom-designed sensory equipment or modified commercially available sensors, in a modular and scalable fashion.

According to a preferred aspect, a system for detecting and characterizing electromagnetic emissions, comprising: a plurality of antennas each configured to receive a radio frequency emission; a radio sensor comprising a processor, a memory, and a plurality of programming instructions stored in the memory and operating on the processor, wherein the plurality of programming instructions, when operating on the processor, cause the processor to: filter the received radio frequency emission to at least mitigate aliasing in a frequency band of interest within the received radio frequency emission; an analog to digital conversion unit configured to convert the filtered radio frequency emission to a time-domain digital dataset; and a signal analyzer comprising a processor, a memory, and a plurality of programming instructions stored in the memory and operating on the processor, wherein the plurality of programming instructions, when operating on the processor, cause the processor to: transform the time-domain digital dataset into a frequency-domain dataset; perform a plurality of measurement-combining operations on at least a portion of the frequency-domain data including at least calculating a parameter per frequency bin and accumulating the calculated parameters per bin; and generate a signal-usage dataset by at least analyzing the digital dataset for a plurality of signal usage patterns based at least in part by analysis of the accumulated bin parameters, is disclosed.

According to another preferred aspect, a method for detecting and characterizing electromagnetic emissions across a wide frequency range, comprising the steps of: receiving radio frequency emissions, using at least one antenna; filtering received radio frequency emissions, using a radio sensor; translating received radio frequency emissions to lower or higher frequencies as needed, using a signal analyzer; converting received electromagnetic emissions to time-domain digital data, using an analog to digital converter; determining the strength of radio frequency emissions, using a signal analyzer and using a processor; determining the location of emission of a received electromagnetic emission, using a signal analyzer; processing electromagnetic emissions data according to at least one algorithm, using a signal analyzer and using a processor; and sending electromagnetic emissions data, using an antenna, is disclosed.

According to various aspects, the disclosure includes a sensor, which is in certain implementations more specifically a software-defined radio (SDR). Distinguishing characteristics from a typical commercially available electromagnetic sensor include the ability to fully reprogram the sensor or SDR in question, rather than simply modify behavior slightly with slight variable input changes. This allows the sensor to improve with updated or new software without having to replace the hardware, and is better suited for adaptive spectrum emissions detection and analysis. Further, according to various aspects, this sensor or SDR is capable of working robustly over a wide frequency range, as opposed to typical narrow-band sensors. Many commercially available components are not designed for this, however this may be accomplished with clever programming, using the aforementioned ability to reprogram the SDR in question, to control a local oscillator and radio-frequency frontend (RF frontend) separately and dynamically, as well as controlling some of the non-software components through dynamic interfaces such as variable attenuation. This allows the sensor or SDR to be flexible in implementation.

According to various aspects, the sensor or SDR may be a modular design, both in terms of the front-end components as well as the interfaces to whichever platform the sensor is mounted, for example, capable of mounting different antennae in varying configurations. This enables it to use a common sensor platform and swap out different components, with minimal testing, to expand the utility of the sensor and optimize it for different environments, on the hardware level. In addition it enables the system to opportunistically take advantage of highly specialized antennas that can be accessed, without being deployed by the system itself, and tap into that signal without having to redesign the sensor. Similarly on the back end of such a sensor, interfaces for physical connection, control and power are a significant portion of the sensor or SDR itself.

According to various aspects, a sensor or SDR may have a "shut-off" switch, both an electronic and a manual physical switch, to deaden either the front-end components or the entire sensor itself, in the event that there is a signal that is harmful to the sensor's operation or some other situation requires the sensor to be deadened.

Further, according to various aspects, the system may use a transmit function in parallel to its receiving functionality in order to extend the range of a sensor. A sensor normally uses a built-in local oscillator to mix with incoming signals; the built-in oscillator has limited frequency range however. By taking a signal transmitted by a sensor and mixing the it with an incoming signal, it is possible to add a first mixing loop prior to the input to the sensor which provides a particularly method of preconditioning and expanding the operable frequency range.

According to various aspects, a radio may have many constraints due to its cost, weight, physical volume or power consumption. For example, a satellite may be limited in available power, allowable weight, and volume, while a wide deployment of radios mounted in fixed locations may be more constrained by cost. It is critical for a single or small number of radios and antennas to be able to capture both high-power and low-power signals over a very wide bandwidth. In one aspect, a wideband radio uses one or more analog filters to limit input power to a narrow region. For example, a radio capturing cell phone signals near 700 MHz may want to filter out very high power digital television stations at about 600 MHz using a high-pass filter and also filter out signals above the band of interest of 1 GHz. By limiting the input power, the radio may use a higher gain setting (or less attenuation) to acquire only the signals of interest and thus optimize the dynamic range of the ADC such that weak signals are sampled above the noise floor. If digital television signals were allowed to reach the amplifier, the gain would have to be reduced and the limited effective bits of the high-speed ADC may no longer be able to sample the weaker uplink signals from cell phones to towers.

To make the radio useful outside the 700-1000 MHz band, different filters could be employed using an RF switch to select between different filter banks or using a tunable filter such as, in one aspect, an yttrium-iron-garnet (YIG) filter.

By filtering to limit power entering the radio, the gain can then be optimized for the narrow range of signals being received. In some aspects, a fixed or adjustable gain stage may be inserted between the filter and the radio input and the gain can be optimized on the fly for each frequency range being sampled, effectively providing a software-driven automatic gain control (AGC) feature. Power can also be optimized by selecting or switching between more than one antenna tuned for a different frequency range.

In some regions of the spectrum, high-power and low-power signals may exist close together in frequency, such that a typical sweep of the radio would collect both in the same instantaneous bandwidth, thus optimizing the software-controllable gain to avoid saturating the high-power signal and possibly getting very poor sampling of the low-power signal.

In one aspect, the radio may perform a fast Fourier transform (FFT) on the received signal and detect thereby spectrum regions of high and low power. The radio may then re-tune a filter such that the high-power region is significantly attenuated by a filter and the low-power region can be resampled with a higher gain thus optimizing ADC dynamic range.

In other aspects, the radio may use a priori information about the spectrum to be monitored. Such information may come from previous data collection, data collected by other networked radios, or a database of frequency allocations (such as, for example in America, Federal Communications Commission (FCC) licensing information about the purpose and power level of different frequency bands). This information can be used to tune the filters to optimize data collection.

In another aspect, both real-time data collection and a priori information may be combined to tune the radio for optimal data collection.

In some aspects, disconnect switches, notch or other analog filters and limiters may be used to protect the radio from high power transmissions such as short bursts of ADS-B or to avoid risks of saturation or hardware damage while collecting other data. In other aspects, transmitters collocated on the platform may communicate with the radio through a communication port or digital control signal to warn the radio not to collect data or to protect the front end before a transmitter is enabled. In one aspect, an ADS-B transmitter may provide a logic signal periodically, such as approximately every 10 milliseconds, before transmitting, and the wideband radio may shut down briefly during this time, only collecting data in between the ADS-B pulses.

In some aspects, the radio may have a limited range that can be sampled, such as 500 MHz-6 GHz. But it may be of interest to acquire signals greater than 6 GHz or below 100 MHz. In this case, a mixer may be used to downconvert signals above 6 GHz to somewhere in the range that a wideband radio can acquire. Alternatively, signals below 500 MHz may be upconverted to be within range of the radio. The upconversion and/or downconversion hardware may have a bypass mode to allow signals to pass directly into the radio. In other aspects, they may be selected using a radio frequency (RF) switch, or by switching inputs on a radio with more than one input. In some aspects, the transmitter on the wideband radio may transmit a pure sine wave that is used as a reference frequency for the mixer to upconvert or downconvert. The transmit frequency may be changed to acquire different input frequency ranges.

Additionally, the radio (e.g. on a satellite) may be subject to wide temperature swings which may affect the gain or frequency response of analog filters, and it may be necessary to periodically calibrate the radio. An RF switch may connect a noise diode and a (for example) 50 ohm load (optionally heated or cooled to a known temperature) or other calibration source to the radio.

In some aspects, the radio may apply analog and/or digital filters to the input signals, which may cause the edges to droop or which may provide some other measurable response. In order to maintain the widest instantaneous bandwidth, it may be advantageous to apply a time domain or frequency domain correction to the sampled signal to reverse the undesirable effects of such filters.

The radio may produce spurs or noise at specific frequencies such as at a local clock or communications port frequency or harmonics thereof. Some of those spurs may be introduced in to the data after the down-conversion stage so they appear in predictable locations at baseband or intermediate frequencies. In some aspects, the data at the spur locations may be re-acquired by tuning the radio to a slightly different frequency and collecting data such that the spurs have been moved out of the way and the desired signals can be detected.

BRIEF DESCRIPTION OF THE DRAWING FIGURES

The accompanying drawings illustrate several aspects and, together with the description, serve to explain the principles of the invention according to the aspects. It will be appreciated by one skilled in the art that the particular arrangements illustrated in the drawings are merely exemplary, and are not to be considered as limiting of the scope of the invention or the claims herein in any way.

DETAILED DESCRIPTION

Figure 1:
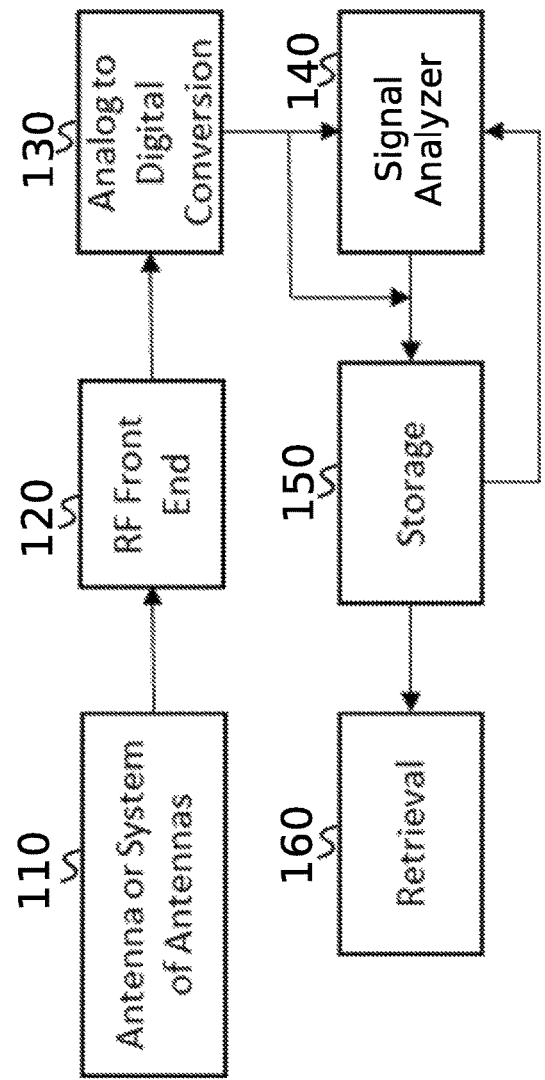
FIG. 1 is a system diagram of core components in an electromagnetic sensor, according to a preferred aspect.

The inventor has conceived, and reduced to practice, a system and methods have been devised for analyzing the spectrum for emitted electromagnetic signals.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Conceptual Architecture

Figure 2:
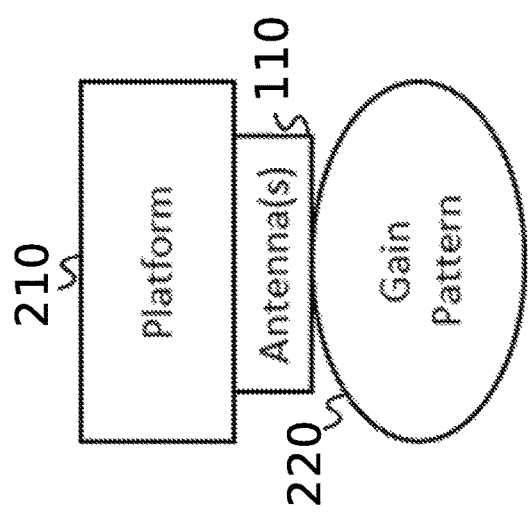
FIG. 2 is a system diagram illustrating one possible antenna configuration for an electromagnetic sensor, according to a preferred aspect.
Figure 3:
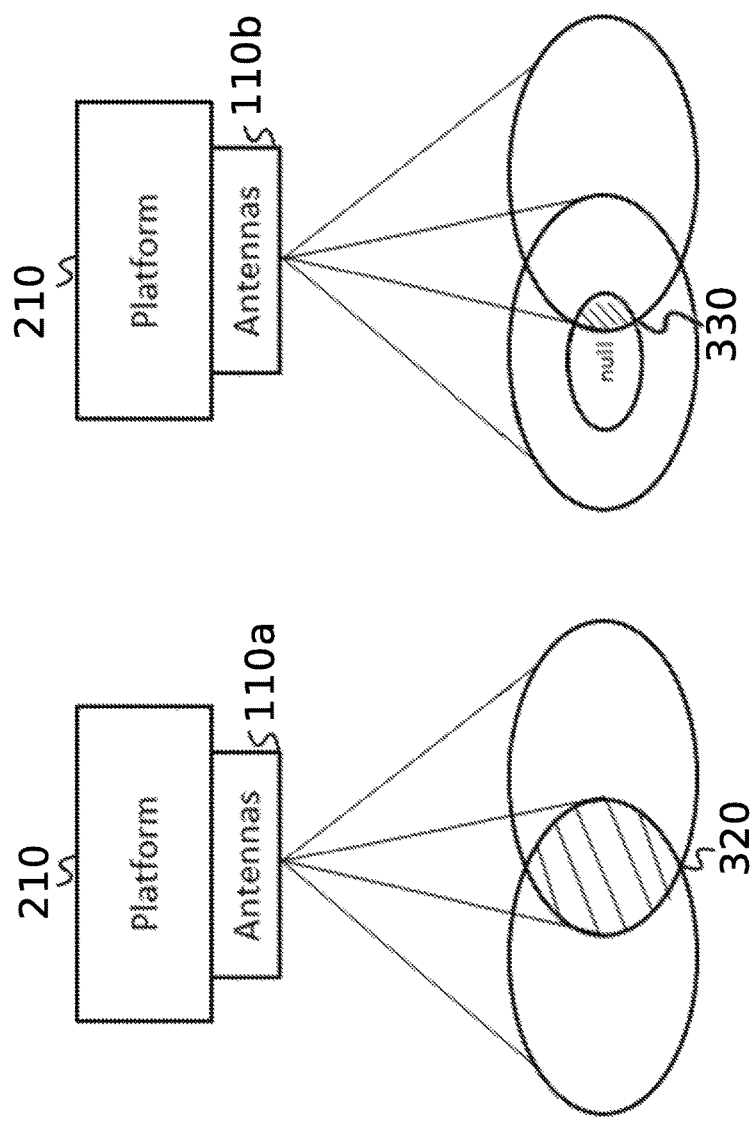
FIG. 3 is a system diagram illustrating one possible antenna configuration of overlapping antenna patterns or positions for an electromagnetic sensor, according to a preferred aspect.
Figure 4:
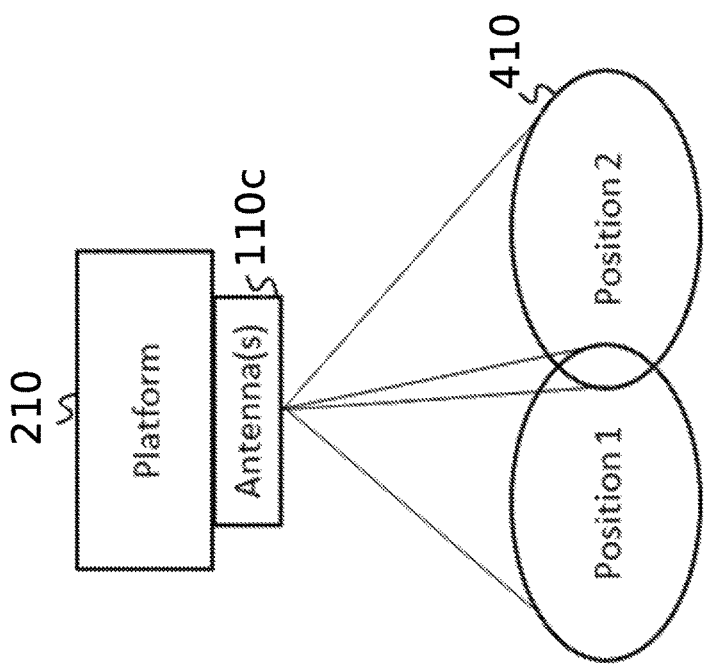
FIG. 4 is a system diagram illustrating one possible antenna configuration for an electromagnetic sensor, using time-varying antenna patterns or positions, according to a preferred aspect.

FIG. 1 is a system diagram of core components in an electromagnetic sensor, according to a preferred aspect. An antenna or system of antennas 110 is connected via electronic circuitry to a radio frequency (RF) frontend 120 for the purposes of picking up and then processing analog electromagnetic signals in the surrounding space or medium (it will be noted that sometimes, in the literature, antennas 110 are considered part of an RF frontend 120). The antenna or system of antennas 110 may be arranged in one of numerous patterns or configurations, as illustrated in FIG. 2, FIG. 3, and FIG. 4. Such an RF frontend 120 may contain at least one RF filter, RF amplifier, local oscillator, and mixer, but need not necessarily contain any specific one of these components, and may contain more components, as required by a specific implementation of the invention. RF frontends are common technological suites in radio receivers and will be known to any person skilled in the art, in various implementations and styles. The RF frontend circuitry will then pass any received signal data to an analog-to-digital converter 130 to convert the analog signal into digital data for further processing. The signal, once converted to digital data, goes to a signal analyzer 140 for further operations to be performed on it, and it is possible (but not necessarily required) for the un-processed signal to be stored 150 in a variety of ways including hard-drives, solid state drives, and other possible storage methodologies, for record-keeping purposes. The signal analyzer 140 also stores 150 the final result of the signal after processing operations are complete, in any one of many possible storage implementations and paradigms, according to a preferred aspect of the invention. After storage of signal data is complete, retrieval of the data 160 is possible, the method of retrieval being dependent on the method of storage, neither of which need be a specific or limiting implementation so long as storage and retrieval of data is possible in the implementation.

According to various aspects, a radio may have many constraints due to its cost, weight, physical volume or power consumption. For example, a satellite may be limited in available power, allowable weight, and volume, while a wide deployment of radios mounted in fixed locations may be more constrained by cost. This creates a need for a radio or small number of radios that are able to receive high- and low-power signals across a wide range of frequencies, rather than being design-limited to a specific frequency range as is common in the art.

FIG. 2 is a system diagram illustrating one possible antenna configuration for an electromagnetic sensor, according to a preferred aspect. In this simplest implementation, a single antenna 110 is attached to a platform 210, which may be a satellite, manned or unmanned aircraft, land vehicle, stationary tower, or another suitable platform for antenna attachment, and this single antenna 110 receives data omni-directionally 220 in a covered area.

FIG. 3 is a system diagram illustrating one possible antenna configuration of overlapping antenna patterns or positions for an electromagnetic sensor, according to a preferred aspect. This second configuration of antennas 110*a-b* is the combination of several simple antennas 110, attached to a platform 210 which may be a satellite, tower, or other suitable antenna-bearing platform, to aid in approximating the location of a signal emission. This is accomplished by overlapping antenna patterns: two antennas 110*a* that are oriented such that a portion of their patterns overlap can use the overlap to detect signals that are present only in the overlapped region 320. The overlap can be in real-time or over successive collection opportunities. Conversely, use of a generally hemispherical antenna plus an antenna with a null 110b can be used to detect a signal that is in the main lobe of the hemispherical antenna while in the null of the other antenna 330. Examples include a log periodic antenna used with a whip antenna, a Butler matrix, and a monopulse antenna configuration. It is possible to use this system of antennas to locate sources using overlap of received signals, for a spatial solution, as well as a more typical solution based on signal strength.

FIG. 4 is a system diagram illustrating one possible antenna configuration for an electromagnetic sensor, using time-varying antenna patterns or positions, according to a preferred aspect. This third form of the antenna system 110c is a scanning antenna, attached to a platform 210 which may be a satellite, tower, or other suitable antenna-bearing platform, whereby the antenna patterns include a beam or beams that are mechanically or electrically scanned or steered over an area of interest 410. These antennas 110c can also be used in conjunction with the other forms of antennas 110. These descriptions of possible antennae configurations need not be limiting on the configurations achievable with this sensory system, as there may be several more possible implementations that may be developed and otherwise used with the same modular system of sensors and processing capabilities on a suitable platform.

Figure 5:
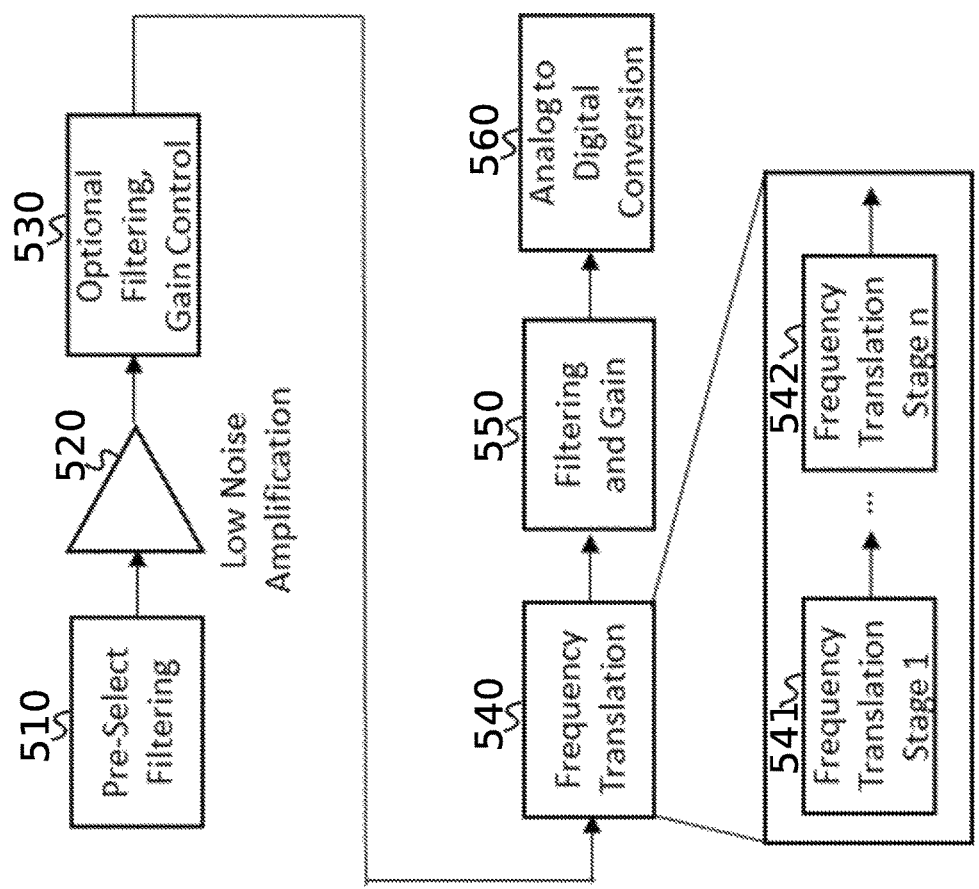
FIG. 5 is method diagram illustrating major functions in a wideband electromagnetic sensor, according to a preferred aspect.

FIG. 5 is method diagram illustrating major functions in a wideband electromagnetic sensor, according to a preferred aspect. The wide range of frequencies used by telecommunications applications of interest drive the need for a tunable and wide bandwidth RF frontend 120. The low signal levels of the target signals drive the need for a low-noise, highly sensitive receiver. Thus, the receiver front end utilizes pre-select filtering 510, low noise amplification 520, optional filtering and gain 530 to bring the signal up to a usable level, tunable heterodyne or direct conversion frequency translation 540 (which may have an indefinite number of steps 541, 542), and optimal filtering and gain 550 to properly condition the signals for conversion to the digital domain 560.

According to the aspect, the radio 120 may perform a fast Fourier transform (FFT) as a pre-select filter 510 on the received signal and detect thereby spectrum regions of high and low power. The radio may then re-tune a filter such that the high-power region is significantly attenuated by a filter 510 and the low-power region can be resampled with a higher gain 520 thus optimizing dynamic range for final analog-to-digital conversion (ADC) 560.

A radio may produce spurs (also called spurious tones; tones that occur within the radio circuit and interfere with or obscure an underlying portion of a radio signal) or noise at specific frequencies, such as at a local clock or communications port frequency or harmonics thereof. One example of this may be demonstrated using universal serial bus (USB) 3.0 or higher-spec connections, and BLUETOOTH™ radio communications; USB 3.0 connections are known to interfere with nearby BLUETOOTH™ radios by creating a large number of spurs, degrading the BLUETOOTH™ communication. According to various aspects, some spurs may be introduced into collected radio signal data after a down-conversion stage so the spurs appear in predictable locations at baseband or intermediate frequencies. In this manner, the data at the spur locations may be re-acquired by tuning the radio to a slightly different frequency and collecting data such that the spurs have been "moved" out of the way of the underlying signal portion, and the desired signals may then be detected and collected.

Multiple stages of frequency translation 540, which may include both up-conversion 541 and down-conversion 542, may be necessary based on the frequency bands of interest. According to the aspect, a wideband radio 120 may utilize one or more analog filters 541, 542 to limit input power to a narrow region. For example, a radio capturing cell phone signals near 700 MHz may want to filter out very high power digital television stations at about 600 MHz using a high-pass filter and also filter out signals above the band of interest of 1 GHz. By limiting the input power, the radio may use a higher gain setting (or less attenuation) to acquire only the signals of interest and thus optimize the dynamic range of the ADC such that weak signals are sampled above the noise floor. If digital television signals were allowed to reach the amplifier, the gain would have to be reduced and the limited effective bits of the high-speed ADC may no longer be able to sample the weaker uplink signals from cell phones to towers. To make the radio useful outside the 700-1000 MHz band, different filters could be employed using an RF switch to select between different filter banks or using a tunable filter such as, for example including but not limited to, an yttrium-iron-garnet (YIG) filter comprising a yttrium-iron-garnet spherical crystal and a pair of conductor half-loops. This acts as a resonator tuned or tunable to a specific frequency, effectively providing a gating operation that filters a signal by only passing through the frequency to which it is tuned.

In some aspects, a radio may have a limited range that can be sampled, such as (for example) 500 MHz-6 GHz. It may be of interest to acquire signals greater than 6 GHz or below 500 MHz. In this case, frequency translation may be used 540 to down-convert signals above 6 GHz to somewhere in the range that a wideband radio can acquire. Alternatively, signals below 500 MHz may be up-converted to be within range of the radio. The up-conversion and/or down-conversion hardware may have a bypass mode to allow signals to pass directly into the radio. In other aspects, they may be selected using a radio frequency (RF) switch, or by switching inputs on a radio with more than one input. In some aspects, the transmitter on the wideband radio may transmit a pure sine wave that is used as a reference frequency for the mixer to up-convert or down-convert. The transmit frequency may be changed to acquire different input frequency ranges. Additionally, the radio (for example, installed or mounted on a satellite) may be subject to wide temperature swings which may affect the gain or frequency response of analog filters, and it may be necessary to periodically calibrate the radio. Frequency translation 540 may comprise a stage utilizing an RF switch connected to a noise diode and a (for example) 50 ohm load (optionally heated or cooled to a known temperature) or other calibration source to the radio, enabling automated calibration to compensate for changes due to environmental conditions such as temperature shift, pressure, humidity, radiation, or other conditions that may affect reception or performance.

By filtering to limit power entering the radio, the gain can then be optimized 550 for the narrow range of signals being received. In some aspects, a fixed or adjustable gain stage 550 may be inserted between the filter(s) 510-540 and the radio input and the gain can be optimized on the fly for each frequency range being sampled, effectively providing a software-driven automatic gain control (AGC) feature.

Power can also be optimized by selecting or switching between more than one antenna tuned for a different frequency range.

In some aspects, a radio may apply analog and/or digital filters 510-540 to input signals, which may cause the edges to droop or which may provide some other measurable response. In order to maintain the widest instantaneous bandwidth, it may be advantageous to apply a time or frequency domain correction to the sampled signal to reverse the undesirable effects of such filters.

In some regions of the spectrum, high-power and low-power signals may exist close together in frequency, such that a typical sweep of the radio would collect both in the same instantaneous bandwidth, thus optimizing the software-controllable gain to avoid saturating the high-power signal and possibly getting very poor sampling of the low-power signal. The analog-to-digital converter 560 should have adequate dynamic range, resolution and sampling rate for the bandwidth of interest. Additionally, automatic or manual gain control 530 may be optional as some frequency bands are likely to have high signal-to-noise ratio (SNR) in addition to the lower SNR signals targeted in this application.

Figure 6:
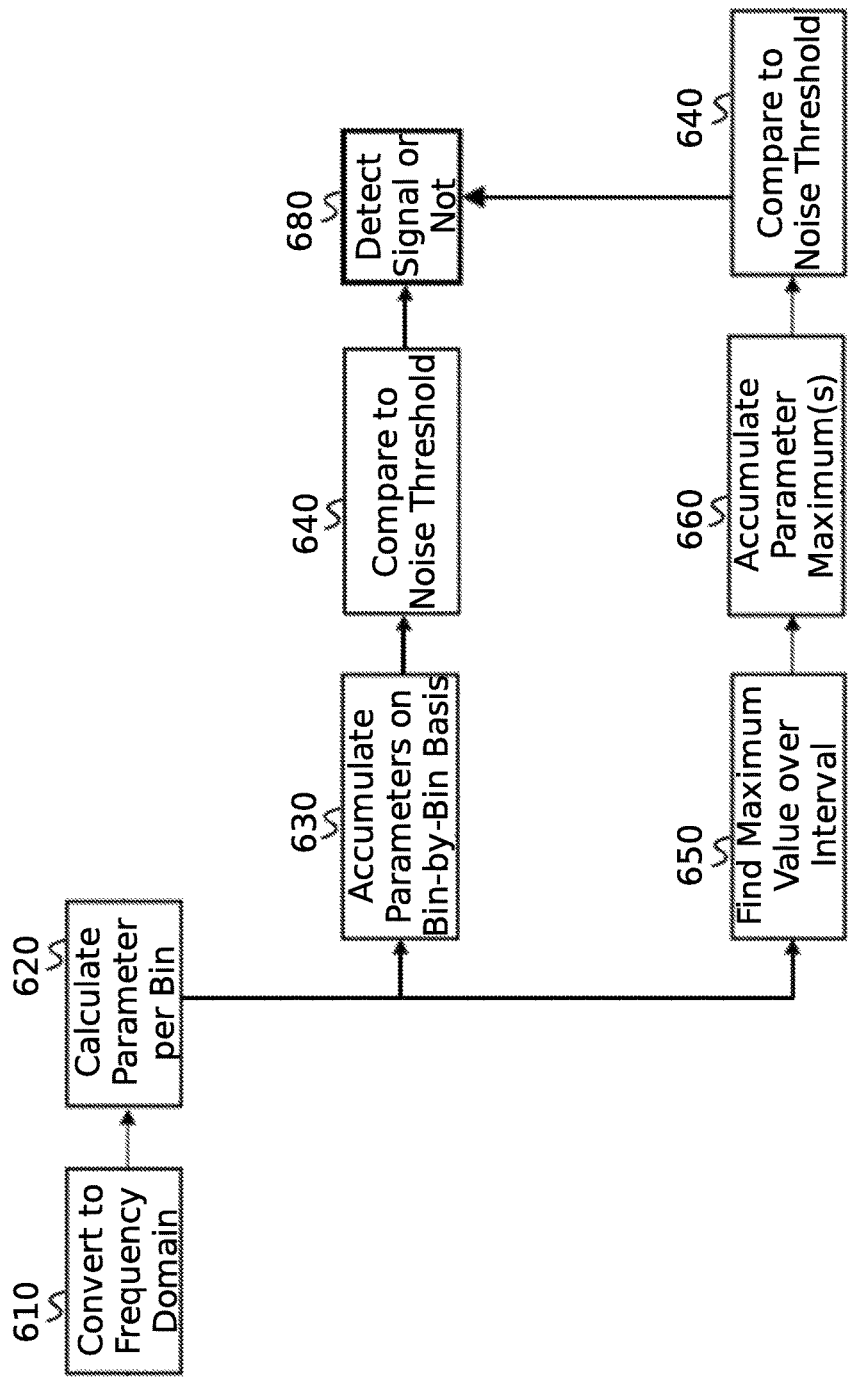
FIG. 6 is a method diagram illustrating major algorithms in an electromagnetic sensor for detecting low level, time-varying, or time-intermittent signals, according to a preferred aspect.

FIG. 6 is a method diagram illustrating major algorithms in an electromagnetic sensor for detecting low level, time-varying, or time-intermittent signals, according to a preferred aspect. The invention includes two algorithms 630, 650 for signal detection. For both algorithms, the time-domain samples from the analog to digital converter are transformed into the frequency domain 610 using a digital implementation of the transform mathematics on the signal analyzer 140, and each parameter is measured and calculated for each bin 620. A measurement-combining algorithm 630 detects persistent low or negative signal to noise ratio (SNR) EM signals 640 for which little or no a priori information about the signal is known or for which implementation or channel effects cause perturbations to the signal. Another measurement-combining algorithm detects time-varying or time-intermittent, low or negative signal to noise ratio (SNR) EM signals 650 for which little or no a priori information about the signal is known or for which implementation or channel effects cause perturbations to the signal. Implementation effects may include but are not limited to transmitter nonlinearities, oscillator drift or instability, and tolerances of components. Channel effects may include but are not limited to fading, multipath, and Doppler shift. The algorithms are applicable to amplitude, phase, and/or frequency modulated signals. The algorithms can be implemented in the signal analyzer 140 of the sensor described in FIG. 1, or post-processed after digital data from the sensor of FIG. 1 is stored 150 and retrieved 160. For the algorithm used with time-varying or time-intermittent signals 650, the parameters, as consistent, are evaluated over a time interval much less than the accumulation interval to identify the maximum value of the parameter over the interval 650. The maximum values are then accumulated over the accumulation interval 660. A noise threshold based on the sensor design is calculated over the entire range of frequencies. The value of the appropriate parameter in each bin is compared to the noise threshold value to determine if a signal is statistically likely to be present 640. A parameter value above the noise threshold indicates the detection of a signal 680.

Figure 11:
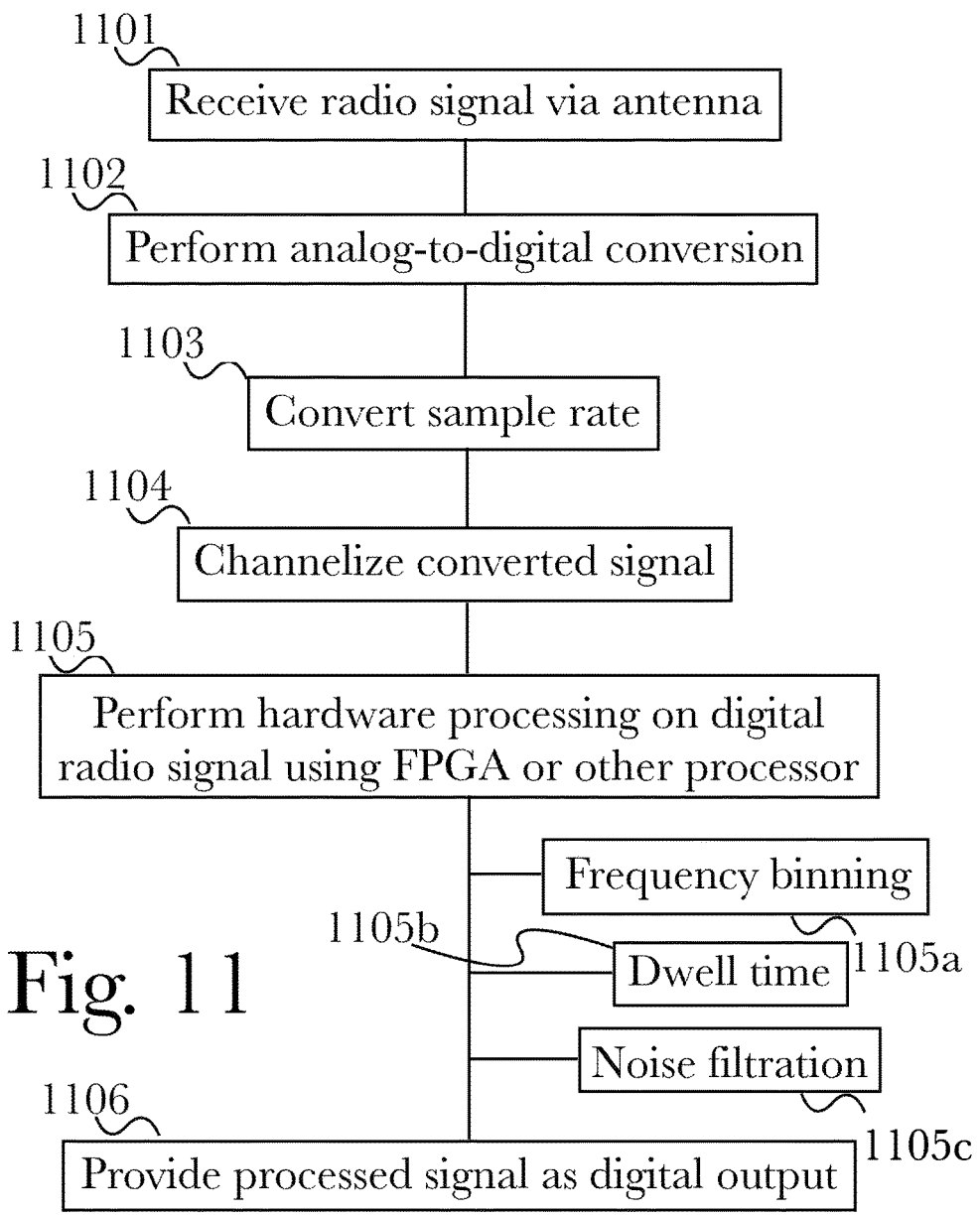
FIG. 11 is a method diagram illustrating the operation of a software-defined radio, according to a preferred aspect.

FIG. 11 is a method diagram illustrating the operation of a software-defined radio, according to a preferred aspect. According to the aspect, a radio signal may first be received 1101 at an antenna, for example a wide-band or narrow-band antenna or a configurable antenna capable of receiving radio signals across a range of frequencies. The received signal may then be converted 1102 from analog to digital, turning the analog signal wave into a digital copy that is suitable for software-based processing. The sample rate may then be converted 1103 and the signal channelized 1104, allowing a single software-defined radio to operate with a wide variety of radio frequencies and transmission protocols that would each ordinarily require specific hardware-based signal processing. A processor such as (for example, and as described below in greater detail with reference to FIG. 7) and FPGA or ASIC may then operate software-based signal processing 1105 that again would traditionally require specific hardware processing circuits. Exemplary signal processing steps may include, but are not limited to, frequency binning 1105a to produce a plurality of individual frequency bins that may be analyzed or interacted with separately, controlling for dwell time 1105b to adjust for the time duration a signal was received at an antenna, or noise filtration 1105c to clean up a signal that may have interference or noise artefacts. After signal processing, the resultant digital radio signal may be provided 1106 as output for further use, review, or storage.

Figure 12:
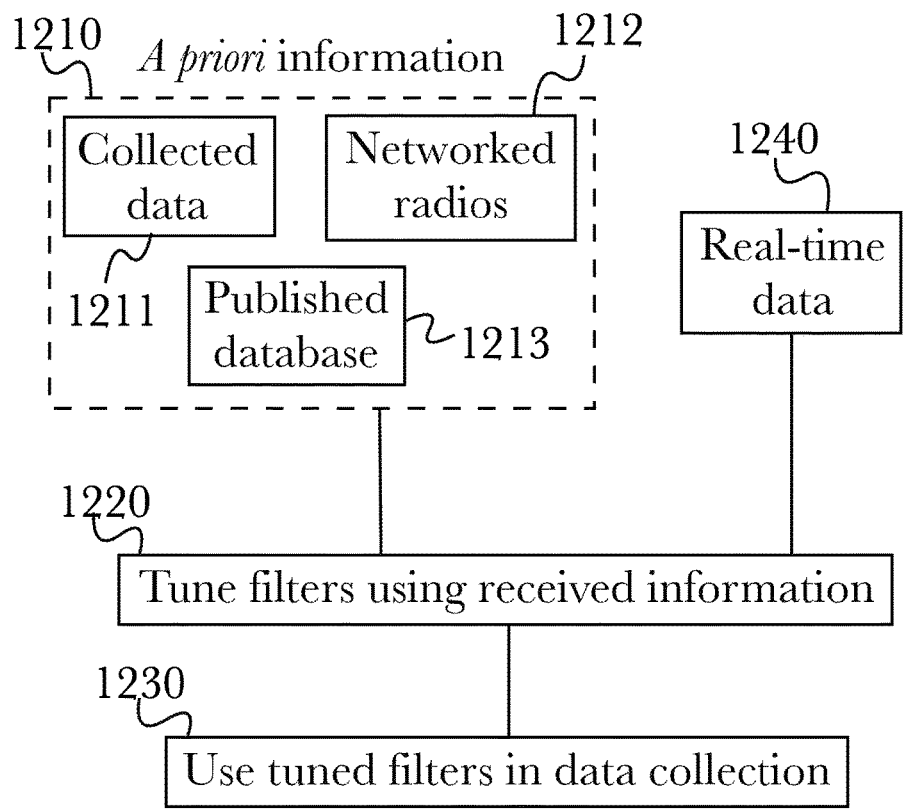
FIG. 12 is a method diagram illustrating a method for using pre-existing information to configure radio filters, according to one aspect.

FIG. 12 is a method diagram illustrating a method 1200 for using pre-existing information to configure radio filters, according to one aspect. According to the aspect, a radio 120 may use a priori information 1210 about the spectrum to be monitored in order to improve the usefulness of a plurality of filters 1220 to be used in data collection 1230 (as described above, with reference to FIG. 5). Such information may be retrieved from previously-collected data 1211, data collected by other networked radios 1212, or received from a published database of frequency allocations 1213 such as, for example including but not limited to, Federal Communications Commission (FCC) licensing information about the purpose and power level of different frequency bands. This information may then be used 1220 to tune filters to optimize data collection 1230. Additionally, both real-time data collection 1240 and a priori information may be combined to tune the radio for optimal data collection, enabling real-time filter tuning to optimize operation without downtime.

Figure 13:
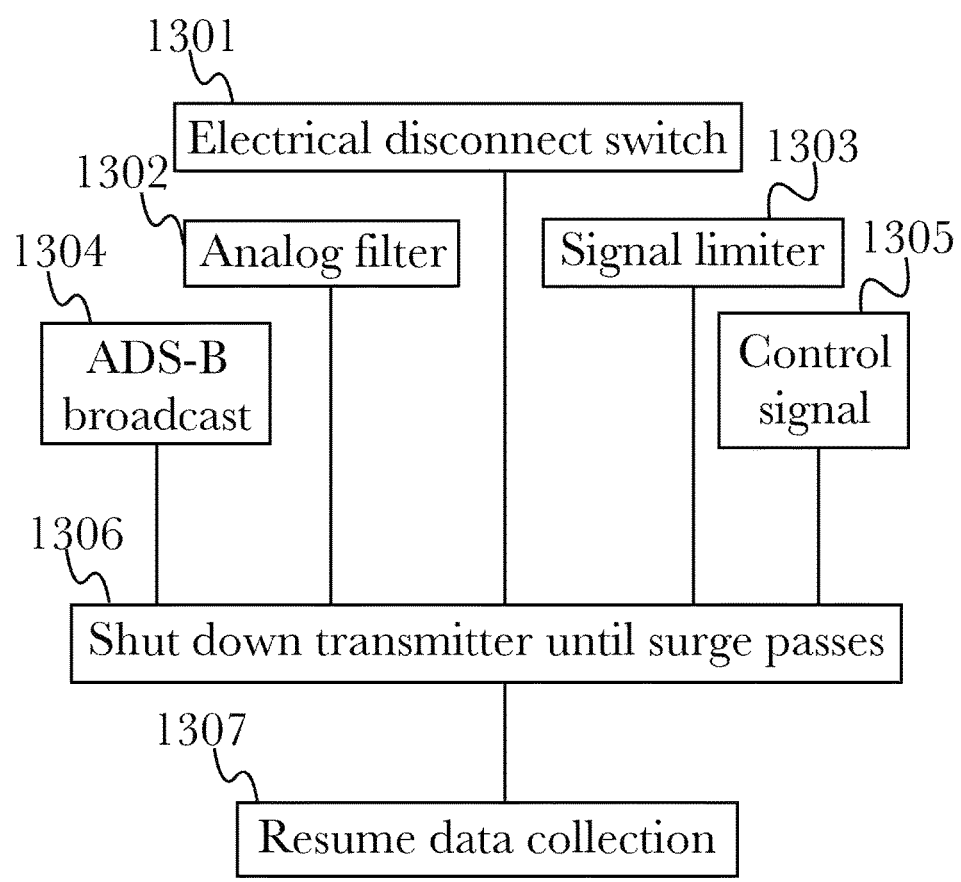
FIG. 13 is a method diagram illustrating a method for protecting a radio from bursts of high-intensity signals, according to one aspect.

FIG. 13 is a method diagram illustrating a method 1300 for protecting a radio from bursts of high-intensity signals, according to one aspect. According to the aspect, a plurality of electrical disconnect switches 1301, notch or other analog filters 1302 or signal limiters 1303 may be used to protect a radio from high power transmissions such as short bursts of automatic dependence surveillance-broadcast (ADS-B), commonly used by aircraft to determine and broadcast their location using satellite navigation information, or to avoid risks of saturation or hardware damage from high-intensity signals while collecting other data. In some aspects, transmitters collocated on an installation platform (for example, a ground-based tower or satellite, as described above with reference to FIG. 5) may communicate with the radio through a communication port or digital control signal 1304 to warn the radio not to collect data or to protect the front end before a transmitter is enabled. In one aspect, an ADS-B transmitter may broadcast a logic signal periodically 1305, such as approximately every 10 milliseconds, before transmitting, and the wideband radio may shut down 1306 briefly during this time, only collecting data 1307 in between the ADS-B pulses.

Hardware Architecture

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit ("ASIC"), or on a network interface card.

Software/hardware hybrid implementations of at least some of the aspects disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be described herein in order to illustrate one or more exemplary means by which a given unit of functionality may be implemented. According to specific aspects, at least some of the features or functionalities of the various aspects disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, or other appropriate computing device), a consumer electronic device, a music player, or any other suitable electronic device, router, switch, or other suitable device, or any combination thereof. In at least some aspects, at least some of the features or functionalities of the various aspects disclosed herein may be implemented in one or more virtualized computing environments (e.g., network computing clouds, virtual machines hosted on one or more physical computing machines, or other appropriate virtual environments).

Figure 7:
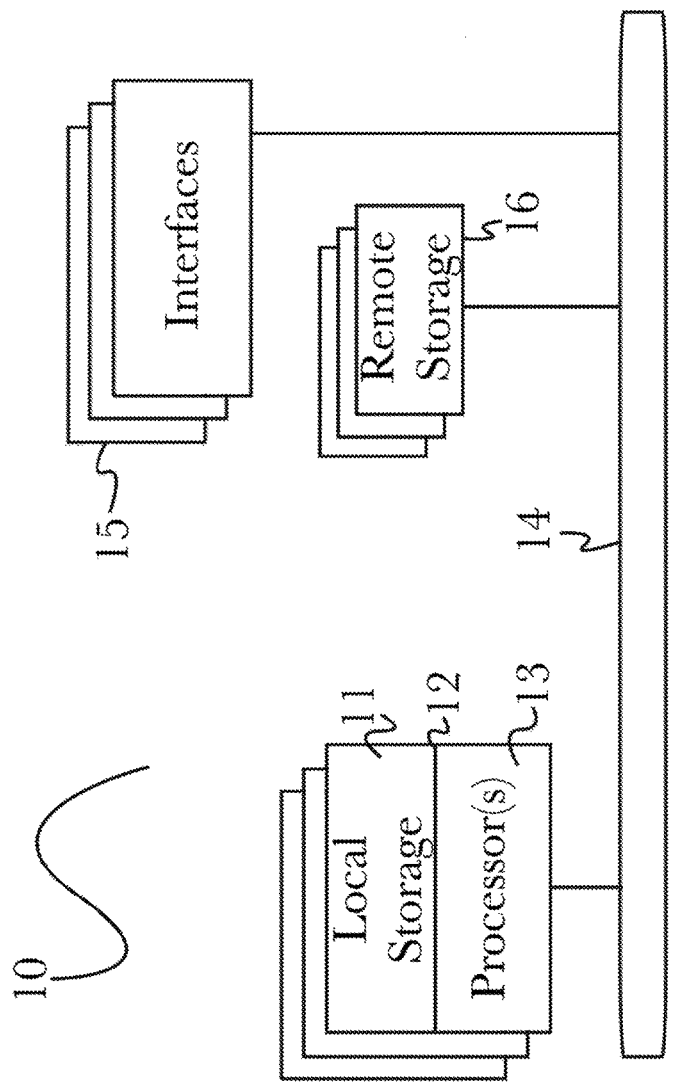
FIG. 7 is a block diagram illustrating an exemplary hardware architecture of a computing device.

Referring now to FIG. 7, there is shown a block diagram depicting an exemplary computing device 10 suitable for implementing at least a portion of the features or functionalities disclosed herein. Computing device 10 may be, for example, any one of the computing machines listed in the previous paragraph, or indeed any other electronic device capable of executing software- or hardware-based instructions according to one or more programs stored in memory. Computing device 10 may be configured to communicate with a plurality of other computing devices, such as clients or servers, over communications networks such as a wide area network a metropolitan area network, a local area network, a wireless network, the Internet, or any other network, using known protocols for such communication, whether wireless or wired.

In one aspect, computing device 10 includes one or more central processing units (CPU) 12, one or more interfaces 15, and one or more busses 14 (such as a peripheral component interconnect (PCI) bus). When acting under the control of appropriate software or firmware, CPU 12 may be responsible for implementing specific functions associated with the functions of a specifically configured computing device or machine. For example, in at least one aspect, a computing device 10 may be configured or designed to function as a server system utilizing CPU 12, local memory 11 and/or remote memory 16, and interface(s) 15. In at least one aspect, CPU 12 may be caused to perform one or more of the different types of functions and/or operations under the control of software modules or components, which for example, may include an operating system and any appropriate applications software, drivers, and the like.

CPU 12 may include one or more processors 13 such as, for example, a processor from one of the Intel, ARM, Qualcomm, and AMD families of microprocessors. In some aspects, processors 13 may include specially designed hardware such as application-specific integrated circuits (ASICs, for example including devices such as an Analog Devices AD9361, which may be used to perform filtering or decimation on radio signals), digital signal processors (DSPs), electrically erasable programmable read-only memories (EEPROMs) or other forms of volatile or non-volatile memory that may store executable instructions or logic and perform processing tasks (for example, including but not limited to FRAM, SRAM, DRAM, dedicated registers or flash storage), field-programmable gate arrays (FPGAs, that may or may not have an integrated microprocessor), and so forth, for controlling operations of computing device 10. In a specific aspect, a local memory 11 (such as non-volatile random access memory (RAM) and/or read-only memory (ROM), including for example one or more levels of cached memory) may also form part of CPU 12. However, there are many different ways in which memory may be coupled to system 10. Memory 11 may be used for a variety of purposes such as, for example, caching and/or storing data, programming instructions, and the like. It should be further appreciated that CPU 12 may be one of a variety of system-on-a-chip (SOC) type hardware that may include additional hardware such as memory or graphics processing chips, such as a QUALCOMM SNAPDRAGON™ or SAMSUNG EXYNOS™ CPU as are becoming increasingly common in the art, such as for use in mobile devices or integrated devices.

As used herein, the term "processor" is not limited merely to those integrated circuits referred to in the art as a processor, a mobile processor, or a microprocessor, but broadly refers to a microcontroller, a microprocessor, a digital signal processor, a programmable logic controller, an application-specific integrated circuit, and any other programmable circuit.

In one aspect, interfaces 15 are provided as network interface cards (NICs). Generally, NICs control the sending and receiving of data packets over a computer network; other types of interfaces 15 may for example support other peripherals used with computing device 10. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, FIREWIRE™, THUNDERBOLT™, PCI, parallel, radio frequency (RF), BLUETOOTH™, near-field communications (e.g., using near-field magnetics), 802.11 (WiFi), frame relay, TCP/IP, ISDN, fast Ethernet interfaces, Gigabit Ethernet interfaces, Serial ATA (SATA) or external SATA (ESATA) interfaces, high-definition multimedia interface (HDMI), digital visual interface (DVI), analog or digital audio interfaces, asynchronous transfer mode (ATM) interfaces, high-speed serial interface (HSSI) interfaces, Point of Sale (POS) interfaces, fiber data distributed interfaces (FDDIs), and the like. Generally, such interfaces 15 may include physical ports appropriate for communication with appropriate media. In some cases, they may also include an independent processor (such as a dedicated audio or video processor, as is common in the art for high-fidelity A/V hardware interfaces) and, in some instances, volatile and/or non-volatile memory (e.g., RAM).

Although the system shown in FIG. 7 illustrates one specific architecture for a computing device 10 for implementing one or more of the inventions described herein, it is by no means the only device architecture on which at least a portion of the features and techniques described herein may be implemented. For example, architectures having one or any number of processors 13 may be used, and such processors 13 may be present in a single device or distributed among any number of devices. In one aspect, a single processor 13 handles communications as well as routing computations, while in other aspects a separate dedicated communications processor may be provided. In various aspects, different types of features or functionalities may be implemented in a system according to the invention that includes a client device (such as a tablet device or smartphone running client software) and server systems (such as a server system described in more detail below).

Regardless of network device configuration, the system of the present invention may employ one or more memories or memory modules (such as, for example, remote memory block 16 and local memory 11) configured to store data, program instructions for the general-purpose network operations, or other information relating to the functionality of the aspects described herein (or any combinations of the above). Program instructions may control execution of or comprise an operating system and/or one or more applications, for example. Memory 16 or memories 11, 16 may also be configured to store data structures, configuration data, encryption data, historical system operations information, or any other specific or generic non-program information described herein.

Because such information and program instructions may be employed to implement one or more systems or methods described herein, at least some network device aspects may include nontransitory machine-readable storage media, which, for example, may be configured or designed to store program instructions, state information, and the like for performing various operations described herein. Examples of such nontransitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory (as is common in mobile devices and integrated systems), solid state drives (SSD) and "hybrid SSD" storage drives that may combine physical components of solid state and hard disk drives in a single hardware device (as are becoming increasingly common in the art with regard to personal computers), memristor memory, random access memory (RAM), and the like. It should be appreciated that such storage means may be integral and non-removable (such as RAM hardware modules that may be soldered onto a motherboard or otherwise integrated into an electronic device), or they may be removable such as swappable flash memory modules (such as "thumb drives" or other removable media designed for rapidly exchanging physical storage devices), "hot-swappable" hard disk drives or solid state drives, removable optical storage discs, or other such removable media, and that such integral and removable storage media may be utilized interchangeably. Examples of program instructions include both object code, such as may be produced by a compiler, machine code, such as may be produced by an assembler or a linker, byte code, such as may be generated by for example a JAVA™ compiler and may be executed using a Java virtual machine or equivalent, or files containing higher level code that may be executed by the computer using an interpreter (for example, scripts written in Python, Perl, Ruby, Groovy, or any other scripting language).

Figure 8:
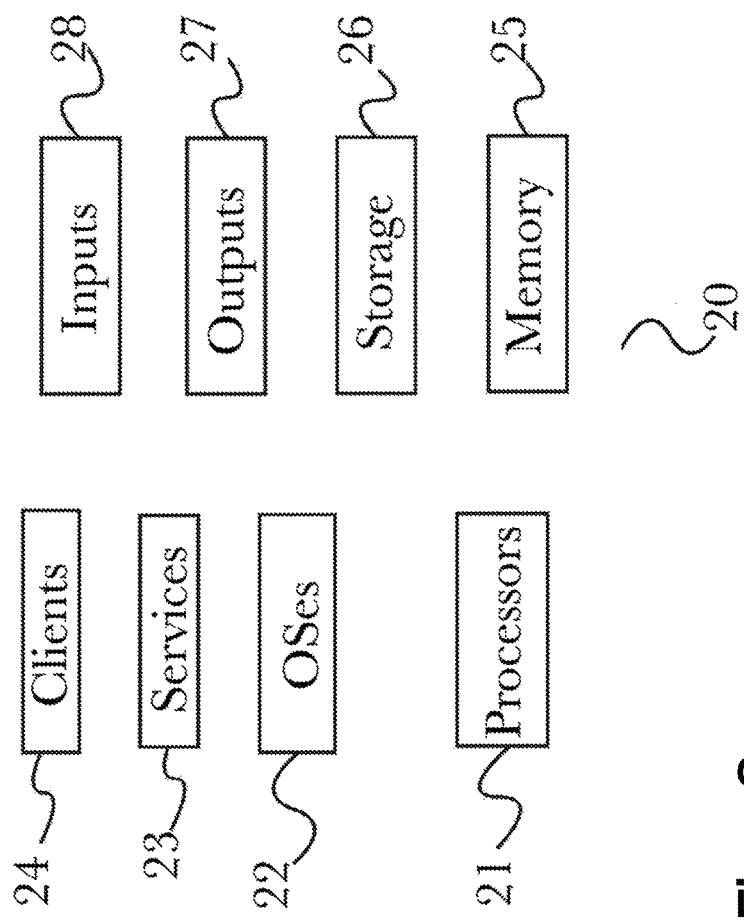
FIG. 8 is a block diagram illustrating an exemplary logical architecture for a client device.

In some aspects, systems according to the present invention may be implemented on a standalone computing system. Referring now to FIG. 8, there is shown a block diagram depicting a typical exemplary architecture of one or more aspects or components thereof on a standalone computing system. Computing device 20 includes processors 21 that may run software that carry out one or more functions or applications of aspects of the invention, such as for example a client application 24. Processors 21 may carry out computing instructions under control of an operating system 22 such as, for example, a version of MICROSOFT WINDOWS™ operating system, APPLE OSX™ or iOS™ operating systems, some variety of the Linux operating system, ANDROID™ operating system, or the like. In many cases, one or more shared services 23 may be operable in system 20, and may be useful for providing common services to client applications 24. Services 23 may for example be WINDOWS™ services, user-space common services in a Linux environment, or any other type of common service architecture used with operating system 21. Input devices 28 may be of any type suitable for receiving user input, including for example a keyboard, touchscreen, microphone (for example, for voice input), mouse, touchpad, trackball, or any combination thereof. Output devices 27 may be of any type suitable for providing output to one or more users, whether remote or local to system 20, and may include for example one or more screens for visual output, speakers, printers, or any combination thereof. Memory 25 may be random-access memory having any structure and architecture known in the art, for use by processors 21, for example to run software. Storage devices 26 may be any magnetic, optical, mechanical, memristor, or electrical storage device for storage of data in digital form (such as those described above, referring to FIG. 7). Examples of storage devices 26 include flash memory, magnetic hard drive, CD-ROM, and/or the like.

Figure 9:
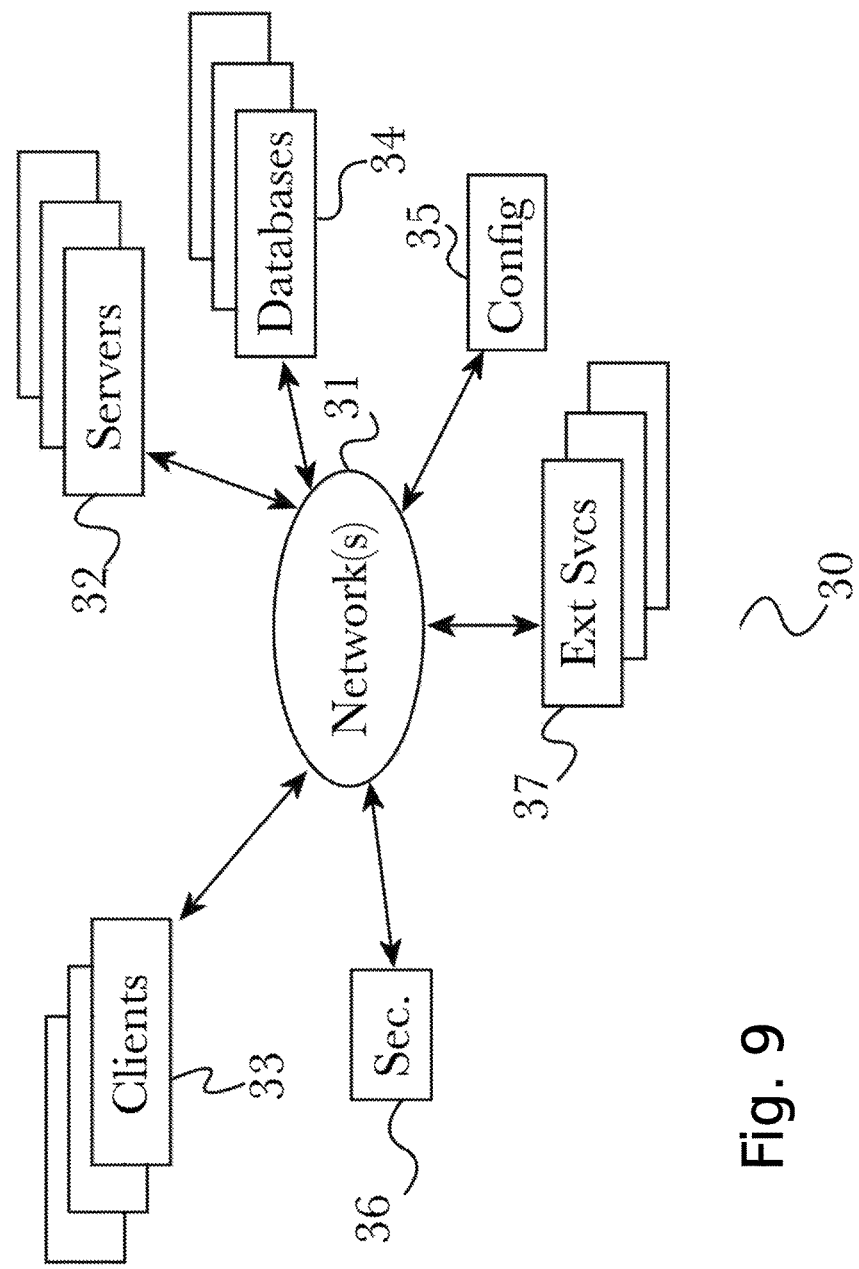
FIG. 9 is a block diagram showing an exemplary architectural arrangement of clients, servers, and external services.

In some aspects, systems of the present invention may be implemented on a distributed computing network, such as one having any number of clients and/or servers. Referring now to FIG. 9, there is shown a block diagram depicting an exemplary architecture 30 for implementing at least a portion of a system according to an aspect of the invention on a distributed computing network. According to the aspect, any number of clients 33 may be provided. Each client 33 may run software for implementing client-side portions of the present invention; clients may comprise a system 20 such as that illustrated in FIG. 8. In addition, any number of servers 32 may be provided for handling requests received from one or more clients 33. Clients 33 and servers 32 may communicate with one another via one or more electronic networks 31, which may be in various aspects any of the Internet, a wide area network, a mobile telephony network (such as CDMA or GSM cellular networks), a wireless network (such as WiFi, WiMAX, LTE, and so forth), or a local area network (or indeed any network topology known in the art; the invention does not prefer any one network topology over any other). Networks 31 may be implemented using any known network protocols, including for example wired and/or wireless protocols.

In addition, in some aspects, servers 32 may call external services 37 when needed to obtain additional information, or to refer to additional data concerning a particular call. Communications with external services 37 may take place, for example, via one or more networks 31. In various aspects, external services 37 may comprise web-enabled services or functionality related to or installed on the hardware device itself. For example, in an aspect where client applications 24 are implemented on a smartphone or other electronic device, client applications 24 may obtain information stored in a server system 32 in the cloud or on an external service 37 deployed on one or more of a particular enterprise's or user's premises.

In some aspects of the invention, clients 33 or servers 32 (or both) may make use of one or more specialized services or appliances that may be deployed locally or remotely across one or more networks 31. For example, one or more databases 34 may be used or referred to by one or more aspects of the invention. It should be understood by one having ordinary skill in the art that databases 34 may be arranged in a wide variety of architectures and using a wide variety of data access and manipulation means. For example, in various aspects one or more databases 34 may comprise a relational database system using a structured query language (SQL), while others may comprise an alternative data storage technology such as those referred to in the art as "NoSQL" (for example, HADOOP CASSANDRA™, GOOGLE BIGTABLE™, and so forth). In some aspects, variant database architectures such as column-oriented databases, in-memory databases, clustered databases, distributed databases, or even flat file data repositories may be used according to the invention. It will be appreciated by one having ordinary skill in the art that any combination of known or future database technologies may be used as appropriate, unless a specific database technology or a specific arrangement of components is specified for a particular aspect herein. Moreover, it should be appreciated that the term "database" as used herein may refer to a physical database machine, a cluster of machines acting as a single database system, or a logical database within an overall database management system. Unless a specific meaning is specified for a given use of the term "database", it should be construed to mean any of these senses of the word, all of which are understood as a plain meaning of the term "database" by those having ordinary skill in the art.

Similarly, most aspects of the invention may make use of one or more security systems 36 and configuration systems 35. Security and configuration management are common information technology (IT) and web functions, and some amount of each are generally associated with any IT or web systems. It should be understood by one having ordinary skill in the art that any configuration or security subsystems known in the art now or in the future may be used in conjunction with aspects of the invention without limitation, unless a specific security 36 or configuration system 35 or approach is specifically required by the description of any specific aspect.

Figure 10:
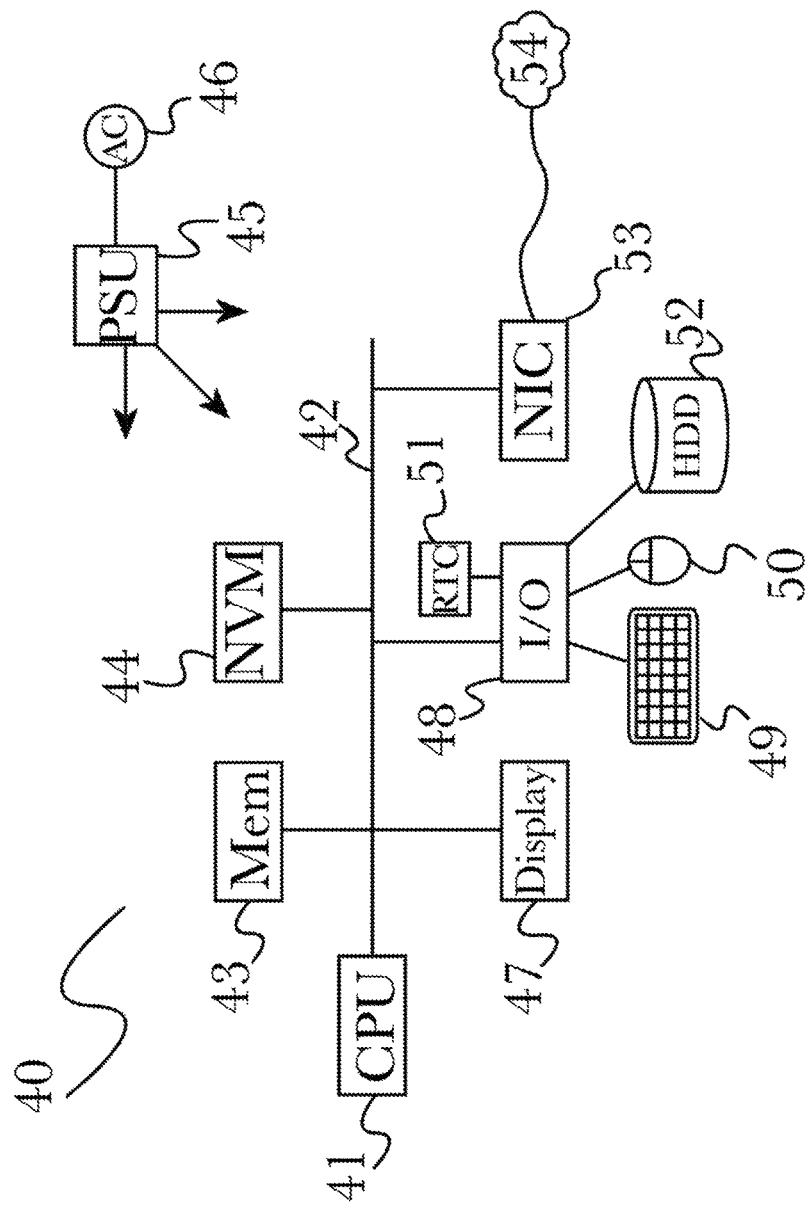
FIG. 10 is another block diagram illustrating an exemplary hardware architecture of a computing device.

FIG. 10 shows an exemplary overview of a computer system 40 as may be used in any of the various locations throughout the system. It is exemplary of any computer that may execute code to process data. Various modifications and changes may be made to computer system 40 without departing from the broader scope of the system and method disclosed herein. Central processor unit (CPU) 41 is connected to bus 42, to which bus is also connected memory 43, nonvolatile memory 44, display 47, input/output (I/O) unit 48, and network interface card (NIC) 53. I/O unit 48 may, typically, be connected to keyboard 49, pointing device 50, hard disk 52, and real-time clock 51. NIC 53 connects to network 54, which may be the Internet or a local network, which local network may or may not have connections to the Internet. Also shown as part of system 40 is power supply unit 45 connected, in this example, to a main alternating current (AC) supply 46. Not shown are batteries that could be present, and many other devices and modifications that are well known but are not applicable to the specific novel functions of the current system and method disclosed herein. It should be appreciated that some or all components illustrated may be combined, such as in various integrated applications, for example Qualcomm or Samsung system-on-a-chip (SOC) devices, or whenever it may be appropriate to combine multiple capabilities or functions into a single hardware device (for instance, in mobile devices such as smartphones, video game consoles, in-vehicle computer systems such as navigation or multimedia systems in automobiles, or other integrated hardware devices).

In various aspects, functionality for implementing systems or methods of the present invention may be distributed among any number of client and/or server components. For example, various software modules may be implemented for performing various functions in connection with the present invention, and such modules may be variously implemented to run on server and/or client components.

The skilled person will be aware of a range of possible modifications of the various aspects described above. Accordingly, the present invention is defined by the claims and their equivalents.

What is claimed is:

1. A system for detecting and characterizing electromagnetic emissions, comprising:
   a plurality of antennas each configured to receive a radio frequency emission, wherein at least one of the plurality of antennas is capable of receiving radio signals over a wide frequency range;
   a radio sensor configured to filter the received radio frequency emission to at least mitigate aliasing in a frequency band of interest within the received radio frequency emission;
   an analog to digital conversion unit configured to convert the filtered radio frequency emission to a time-domain digital dataset; and
   a signal analyzer comprising a processor, a memory, and a plurality of programming instructions stored in the memory and operating on the processor, wherein the plurality of programming instructions, when operating on the processor, cause the processor to:
   transform the time-domain digital dataset into a frequency-domain dataset;
   perform a plurality of measurement-combining operations on at least a portion of the frequency-domain data including at least calculating a parameter per frequency bin and accumulating the calculated parameters per bin; and
   generate a signal-usage dataset by at least analyzing the digital dataset for a plurality of signal usage patterns based at least in part by analysis of the accumulated bin parameters.

2. The system of claim 1, wherein at least a portion of the filtered received radio transmission is amplified by the radio sensor.

3. The system of claim 1, wherein the radio sensor performs frequency translation on at least a portion of the filtered received radio transmission.

4. The system of claim 1, wherein the signal analyzer determines a noise threshold based at least in part on at least one of the plurality of antennas.

5. The system of claim 1, wherein the signal usage patterns comprise low signal-to-noise ratio signals.

6. The system of claim 1, wherein the signal usage patterns comprise a signal noise floor.

7. The system of claim 1, wherein the radio sensor further comprises a modular back-end interface configured for use in any of a variety of platforms drawn from the set of satellites, spacecraft, aircraft, land vehicles, and stationary land mounts.

8. The system of claim 1, wherein the radio sensor further comprises a local oscillator that mixes a transmitted signal with incoming signals to expand the frequency range detection capability.

9. The system of claim 1, wherein the plurality of antennas comprises multiple wide or narrow band antennas in a variety of configurations capable of locating electromagnetic signal sources and densities and measuring emissions across an indeterminate land area dependent on the scale of the implementation of the system.

10. The system of claim 1, wherein the radio sensor notifies a local or remote radio transmitter that it should start or stop transmitting on a plurality of specific frequencies, frequency ranges or time windows, periodic time window or aperiodic time assignments within a frequency or frequency range.

11. The system of claim 1, wherein the radio sensor is a software-defined radio.

12. The system of claim 1, wherein the system operates on a satellite in orbit above the Earth.

* * * * *

UNITED STATES PATENT AND TRADEMARK OFFICE
CERTIFICATE OF CORRECTION

PATENT NO. : 10,338,118 B1
APPLICATION NO. : 15/991540
DATED : July 2, 2019
INVENTOR(S) : Benjamin Kempke et al.

It is certified that error appears in the above-identified patent and that said Letters Patent is hereby corrected as shown below:

Item (72), the residence for inventor Jennifer Alvarez should be corrected to read:
Jennifer Alvarez, Westminster, CO (US)

Signed and Sealed this
Twentieth Day of August, 2019

Andrei Iancu
*Director of the United States Patent and Trademark Office*